United States Patent
He et al.

(10) Patent No.: US 10,971,421 B1
(45) Date of Patent: Apr. 6, 2021

(54) GASKET FOR ELECTRICALLY CONDUCTIVE THERMAL INTERFACE MATERIAL OVER A BARE DIE PACKAGE

(71) Applicant: Dell Products L.P., Round Rock, TX (US)

(72) Inventors: Qinghong He, Austin, TX (US); Travis North, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/672,716

(22) Filed: Nov. 4, 2019

(51) Int. Cl.
*H05K 7/20* (2006.01)
*H01L 23/367* (2006.01)
*H05K 1/02* (2006.01)
*G06F 1/20* (2006.01)

(52) U.S. Cl.
CPC .......... *H01L 23/3675* (2013.01); *G06F 1/20* (2013.01); *H05K 1/0203* (2013.01); *H05K 7/20509* (2013.01)

(58) Field of Classification Search
CPC .......... H05K 7/20336; H05K 7/20454; H05K 7/20472–20481; H05K 7/20509; H05K 1/0203; H05K 2201/062; H01L 23/36–473
See application file for complete search history.

(56) References Cited

U.S. PATENT DOCUMENTS

| | | | | |
|---|---|---|---|---|
| 5,706,171 A | * | 1/1998 | Edwards | H01L 23/42 257/717 |
| 6,292,362 B1 | * | 9/2001 | O'Neal | H01L 23/42 165/122 |
| 6,390,475 B1 | * | 5/2002 | Eckblad | F16J 15/064 165/80.3 |
| 6,891,259 B2 | * | 5/2005 | Im | H01L 23/16 257/687 |
| 7,268,428 B2 | * | 9/2007 | Edwards | H01L 23/04 257/712 |
| 7,990,700 B2 | * | 8/2011 | Guo | G06F 1/184 361/679.48 |
| 10,098,220 B2 | * | 10/2018 | Liang | H05K 7/2039 |
| 10,418,309 B1 | * | 9/2019 | Sahu | H01L 21/4882 |
| 2003/0051868 A1 | * | 3/2003 | Dishongh | F28F 13/00 165/185 |
| 2004/0036183 A1 | * | 2/2004 | Im | H01L 23/42 257/796 |
| 2012/0139093 A1 | * | 6/2012 | Start | H01L 21/50 257/687 |

(Continued)

Primary Examiner — Zachary Pape
(74) Attorney, Agent, or Firm — Baker Botts L.L.P.

(57) ABSTRACT

An information handling system, including a substrate including a plurality of exposed electrical components on a top surface of the substrate; a bare die positioned on the top surface of the substrate; a gasket positioned on the top surface of the substrate, the gasket is non-electrically conductive; and an electrically conductive thermal interface material (TIM) positioned on a top surface of the bare die, wherein a top surface of the gasket and a top surface of the electrically conductive TIM are substantially flush, wherein the top surface of the electrically conductive TIM and the top surface of the gasket are opposite the top surface of the substrate, wherein the gasket inhibits contact between the electrically conductive TIM and the exposed electrical components.

17 Claims, 3 Drawing Sheets

(56) References Cited

U.S. PATENT DOCUMENTS

| | | | |
|---|---|---|---|
| 2017/0221788 A1* | 8/2017 | Yeh | H01L 23/367 |
| 2020/0126887 A1* | 4/2020 | Lin | H01L 23/3737 |
| 2020/0203254 A1* | 6/2020 | Dhane | H01L 23/3114 |
| 2020/0214175 A1* | 7/2020 | Anglin Williams | H05K 7/20454 |

* cited by examiner

GASKET FOR ELECTRICALLY CONDUCTIVE THERMAL INTERFACE MATERIAL OVER A BARE DIE PACKAGE

BACKGROUND

Field of the Disclosure

The disclosure relates generally to information handling systems, and in particular, a gasket for electrically conductive thermal interface material over a bare die package of an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Bare die packages, such as mobile processors, can include an exposed die on a substrate. A top surface of the bare die can be electronically insulated; however, a substrate of the bare die package often has other small electronic components (exposed vias and traces) that are not electrically insulated. A thermal interface material can cover the surface of the die package. To achieve such, a portion of the thermal interface material can migrate outside of the die area and may come into contact with the small components or traces on the substrate, which is undesirable.

SUMMARY

Innovative aspects of the subject matter described in this specification may be embodied in an information handling system, including a substrate including a plurality of exposed electrical components on a top surface of the substrate; a bare die positioned on the top surface of the substrate; a gasket positioned on the top surface of the substrate, the gasket is non-electrically conductive; and an electrically conductive thermal interface material (TIM) positioned on a top surface of the bare die, wherein a top surface of the gasket and a top surface of the electrically conductive TIM are substantially flush, wherein the top surface of the electrically conductive TIM and the top surface of the gasket are opposite the top surface of the substrate, wherein the gasket inhibits contact between the electrically conductive TIM and the exposed electrical components.

These and other embodiments may each optionally include one or more of the following features. For instance, the gasket is removeable. Further including a cold plate in contact with the electrically conductive TIM. The gasket maintains a positioning of the electrically conductive TIM with respect to the bare die. The gasket comprises a silicon-based material. The gasket comprises a polyurethane material. The electronical components are positioned between the top surface of the substrate and a bottom surface of the gasket, the bottom surface of the gasket opposite the top surface of the gasket. The gasket includes an opening, the gasket positioned on the top surface of the substrate such that the bare die is positioned within the opening.

Innovative aspects of the subject matter described in this specification may be embodied in an information handling system, including a substrate including a plurality of exposed electrical components on a top surface of the substrate; a bare die positioned on the top surface of the substrate; a gasket positioned on the top surface of the substrate, the gasket including an opening, the bare die positioned within the opening, the gasket is non-electrically conductive; and an electrically conductive thermal interface material (TIM) positioned on a top surface of the bare die, wherein a top surface of the gasket and a top surface of the electrically conductive TIM are substantially flush, wherein the top surface of the electrically conductive TIM and the top surface of the gasket are opposite the top surface of the substrate, wherein the electrical components are positioned between the top surface of the substrate and a bottom surface of the gasket such that the gasket inhibits contact between the electrically conductive TIM and the exposed electrical components, the bottom surface of the gasket opposite the top surface of the gasket.

These and other embodiments may each optionally include one or more of the following features. For instance, the gasket is removeable. Further including a cold plate in contact with the electrically conductive TIM. The gasket maintains a positioning of the electrically conductive TIM with respect to the bare die package. The gasket comprises a silicon-based material. The gasket comprises a polyurethane material.

Innovative aspects of the subject matter described in this specification may be embodied in an apparatus including a non-electrically conductive gasket positioned on a top surface of a substrate, the gasket inhibiting contact between i) an electrically conductive thermal interface material (TIM) positioned on to a top surface of a bare die that is positioned on the top surface of the substrate and ii) exposed electrical components positioned on the top surface of the substrate, wherein a top surface of the gasket and a top surface of the electrically conductive TIM are substantially flush, wherein the top surface of the electrically conductive TIM and the top surface of the gasket are opposite the top surface on the substrate.

These and other embodiments may each optionally include one or more of the following features. For instance, the gasket includes an opening, the gasket positioned on the top surface of the substrate such that the bare die is positioned within the opening. The gasket comprises a silicon-based material.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

This document describes an electrical component stack that includes a gasket positioned on a bare die package that seals a top of the substrate of the bare die package (while exposing the bare die top surface) so that an electrically conductive thermal material can be positioned in contact with the bare die. This provides a thermal conductivity to the component stack.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Figure 1:
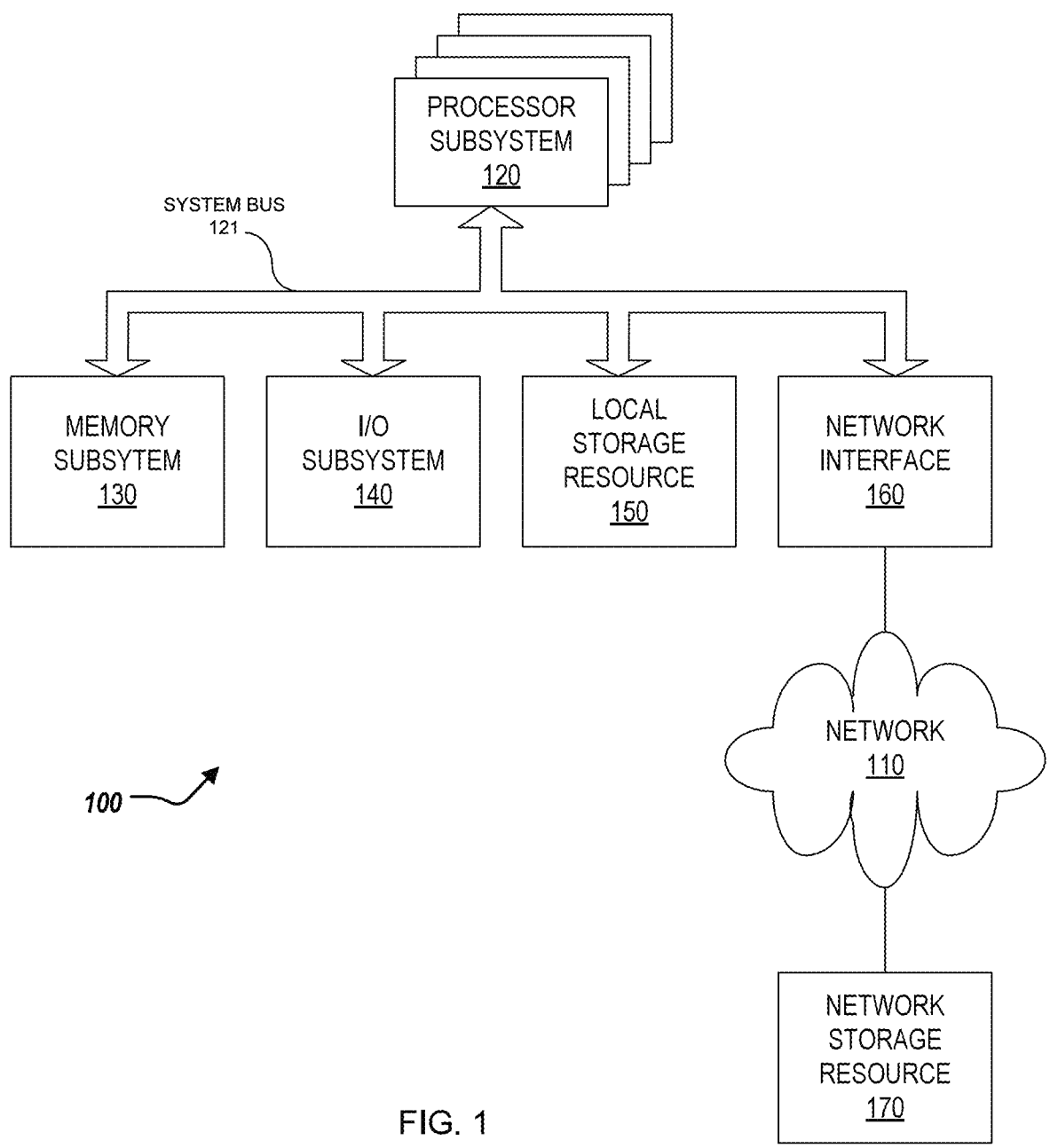
FIG. 1 is a block diagram of selected elements of an embodiment of an information handling system.
Figure 2A:
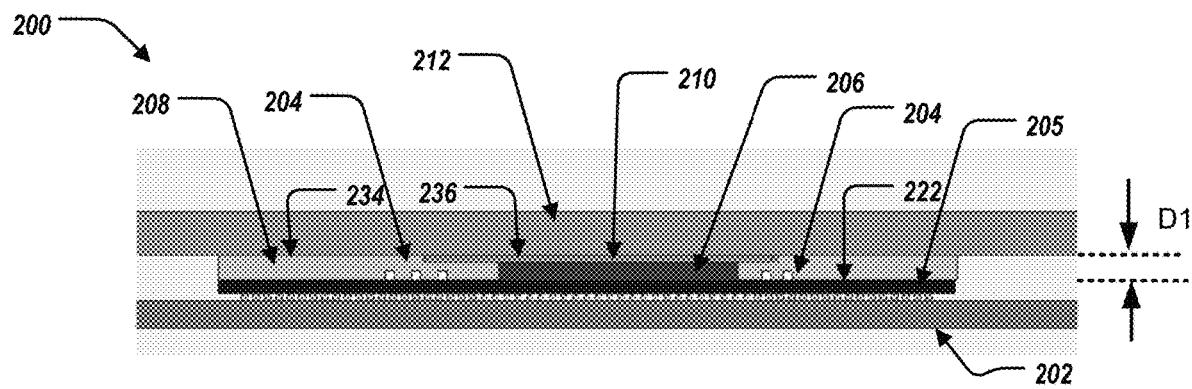
FIG. 2A is a side view of an electrical component stack.
Figure 2B:
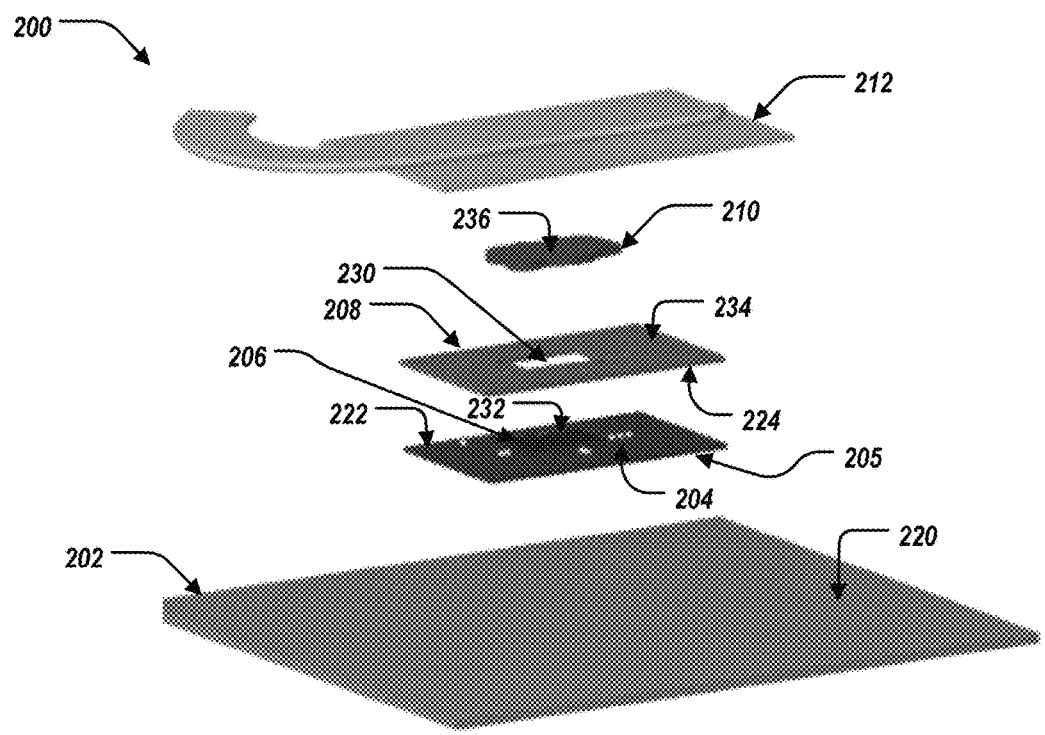
FIG. 2B is an exploded view of the electrical component stack.
Figure 3:
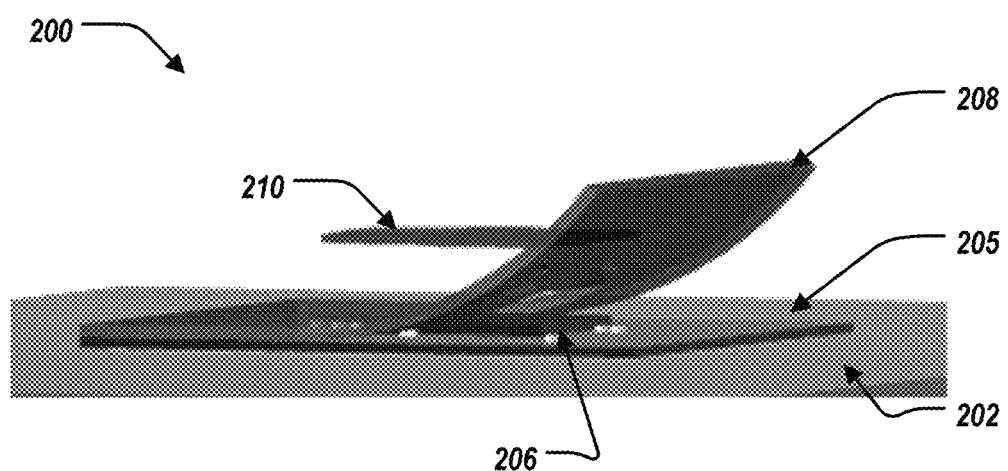
FIG. 3 is a perspective view of the electrical component stack.

Particular embodiments are best understood by reference to FIGS. 1-3 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, T1, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Turning to FIGS. 2A and 2B, FIGS. 2A and 2B illustrates a portion of an information handling system (e.g., the information handling system 100 of FIG. 1), including an electrical component stack 200. The stack 200 can include a mainboard 202, exposed electrical components 204, a substrate 205, a bare die 206, a gasket 208, an electrically conductive thermal interface material (TIM) 210, and a cold plate 212. In short, the gasket 208 can prevent, or inhibit, the electrically conductive TIM 210 from contacting the exposed electrical components 204, described further herein. In some examples, the component stack 200 can form at least a portion of the processor subsystem 120. That is, the bare die 206 can form a portion of the processor subsystem 120 for interpreting and/or executing program instructions and/or process data of the information handling system 100.

The substrate 205 can be positioned on a top surface 220 of the mainboard 202. The substrate 202 can include the exposed electrical components 204 on a top surface 222 of the substrate 205. The exposed electrical components 204 can include exposed traces and/or exposed vias around the bare die 206. The bare die 206 can be positioned on the top surface 222 of the substrate 205.

The gasket 208 can be positioned on the top surface 222 of the substrate 205. Specifically, a bottom surface 224 of the gasket 208 can be adjacent to the top surface 222 of the substrate 205. The electrical components 204 can be positioned between the top surface 222 of the substrate 205 and the bottom surface 224 of the gasket 208. The gasket 208 can further include an opening 230. The gasket 208 can be positioned on the top surface 222 of the substrate 205 such that the bare die 206 is positioned within the opening 230. That is, the gasket 208 is positioned on the top surface 222 of the substrate 205 such that i) the bare die 206 is positioned within the opening 230, and ii) the electrical components are positioned between the top surface 222 of the substrate 205 and the bottom surface 224 of the gasket 208.

In some examples, the gasket 208 is flexible such that the gasket 208 can be removed (i.e., is "removeable") from the top surface 222 of the substrate 205, as shown in FIG. 3. In some examples, the gasket 208 is coupled to the top surface 222 of the substrate 205—e.g., the gasket 208 is adhered to the top surface 222 of the substrate 205 (via an adhesive).

In some examples, the gasket 208 is formed of a non-electrically conductive material. That is, the gasket 208 can have a high electrical insulation property. In some examples, the gasket 208 is formed of a silicon-based material. In some examples, the gasket 208 is formed of a polyurethane material.

In some examples, the gasket 208 can be formed on the top surface 222 of the substrate 205 in a potting process.

The electrically conductive TIM 210 can be positioned on a top surface 232 of the bare die 206. In some examples, a top surface 234 of the gasket 208 and a top surface 236 of the electrically conductive TIM 210 are substantially flush (e.g., after assembly of the stack 200). That is, the top surface 234 of the gasket 208 and the top surface 236 of the electrically conductive TIM 210 are both approximately the same distance D1 from the top surface 222 of the substrate 205. The top surface 234 of the gasket 308 is opposite the bottom surface 224 of the gasket 208. The top surface 236 of the electrically conductive TIM 210 and the top surface of the gasket 308 are opposite the top surface 222 of the substrate 205.

To that end, the gasket 208 can inhibit contact between the electrically conductive TIM 210 and the electrical components 204. That is, the gasket 208 can electrically isolate the bare die 206. In some examples, the gasket 208 minimizes, if not prevents, contact between the electrically conducive TIM 210 and the electrical components 204. To that end, by positioning the gasket 208 on the top surface 222 of the substrate 205, the electrically conducive TIM 210 can provide a thermal interface for the component stack 200 while inhibiting contact between the electrically conductive TIM 210 and the electrical components 204. As a result, the electrically conductive TIM 210 can provide increased thermal conductivity (as compared to electrically non-conductive interface material) such that TIM resistance is reduced.

In some examples, the gasket 208 can maintain a positioning of the electrically conductive TIM 210 with respect to the bare die 206. That is, the gasket 208 can minimize, if not prevent, movement of the electrically conductive TIM 210 with respect to the bare die 206. As a result, this can further facilitate inhibiting contact between the electrically conductive TIM 210 and the electrical components 204.

The cold plate 212 can be in contact with the electrically conductive TIM 210 to facilitate operation of heating sinking away from the bare die 206. In some examples, the gasket 208 can fully contact the cold plate 212 to minimize, if not prevent, the electrically conductive TIM 210 from migrating from outside the gasket 208 area. In some examples, the electrically conductive TIM 210 can reduce thermal interface resistance between the cold plate 212 and the bare die 206.

In some examples, the gasket 208 is compressible such that a seal is generated between the substrate 205 and the cold plate 212. For example, the gasket 208 can be compressible up to 20% of its uncompressed state. For example, the gasket 208 can be compressible such that upon compression, the gasket 208 maintains the positioning of the electrically conductive TIM 210 with respect to the bare die 206. In some examples, the compressibility of the gasket 208 is based on a height of the bare die 206—e.g., a distance between the top surface 222 of the substrate 205 and the electrically conducive TIM 210.

In some examples, the gasket 208 facilitates distribution of pressure applied to the stack 200, e.g., across the entire stack 200 and not a portion thereof—the bare die 206.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An information handling system, comprising:
   a substrate including a plurality of exposed electrical components on a top surface of the substrate;
   a bare die positioned on the top surface of the substrate;
   a gasket positioned on the top surface of the substrate, the gasket is non-electrically conductive; and
   an electrically conductive thermal interface material (TIM) positioned on a top surface of the bare die and extending beyond the bare die such that at least a portion of the electrically conductive TIM is in superimposition with the exposed electrical components on the top surface of the substrate, wherein a top surface of the gasket and a top surface of the electrically conductive TIM are substantially flush, wherein the top surface of the electrically conductive TIM and the top surface of the gasket are opposite the top surface of the substrate,
   wherein the gasket is in superimposition with the substrate and the portion of the electrically conductive TIM that extends beyond the bare die is in superimposition with the gasket such that the gasket is i) positioned between the electrically conducive TIM that extends beyond the bare die and the exposed electrical components on the top surface of the substrate and ii) is in contact with the bare die such that the gasket inhibits contact between the electrically conductive TIM that extends beyond the bare die and the exposed electrical components that are in superimposition with the electrically conductive TIM.

2. The information handling system of claim 1, wherein the gasket is removeable.

3. The information handling system of claim 1, further comprising a cold plate in contact with the electrically conductive TIM.

4. The information handling system of claim 1, wherein the gasket maintains a positioning of the electrically conductive TIM with respect to the bare die.

5. The information handling system of claim 1, wherein the gasket comprises a silicon-based material.

6. The information handling system of claim 1, wherein the gasket comprises a polyurethane material.

7. The information handling system of claim 1, wherein the electrical components are positioned between the top surface of the substrate and a bottom surface of the gasket, the bottom surface of the gasket opposite the top surface of the gasket.

8. The information handling system of claim 1, wherein the gasket includes an opening, the gasket positioned on the top surface of the substrate such that the bare die is positioned within the opening.

9. An information handling system, comprising:
a substrate including a plurality of exposed electrical components on a top surface of the substrate;
a bare die positioned on the top surface of the substrate;
a gasket positioned on the top surface of the substrate, the gasket including an opening, the bare die positioned within the opening, the gasket is non-electrically conductive; and
an electrically conductive thermal interface material (TIM) positioned on a top surface of the bare die and extending beyond the bare die such that at least a portion of the electrically conductive TIM is in superimposition with the exposed electrical components on the top surface of the substrate, wherein a top surface of the gasket and a top surface of the electrically conductive TIM are substantially flush, wherein the top surface of the electrically conductive TIM and the top surface of the gasket are opposite the top surface of the substrate,
wherein the electrical components are positioned between the top surface of the substrate and a bottom surface of the gasket,
wherein the gasket is in superimposition with the substrate and the portion of the electrically conductive TIM that extends beyond the bare die is in superimposition with the gasket such that the gasket is i) positioned between the electrically conducive TIM that extends beyond the bare die and the exposed electrical components on the top surface of the substrate and ii) is in contact with the bare die such that the gasket inhibits contact between the electrically conductive TIM that extends beyond the bare die and the exposed electrical components that are in superimposition with the electrically conductive TIM, the bottom surface of the gasket opposite the top surface of the gasket.

10. The information handling system of claim 9, wherein the gasket is removeable.

11. The information handling system of claim 9, further comprising a cold plate in contact with the electrically conductive TIM.

12. The information handling system of claim 9, wherein the gasket maintains a positioning of the electrically conductive TIM with respect to the bare die package.

13. The information handling system of claim 9, wherein the gasket comprises a silicon-based material.

14. The information handling system of claim 9, wherein the gasket comprises a polyurethane material.

15. An apparatus, comprising:
a non-electrically conductive gasket positioned on a top surface of a substrate, the gasket positioned between i) an electrically conductive thermal interface material (TIM) that extends beyond a top surface of a bare die that the electrically conductive TIM is positioned on, the bare die positioned on the top surface of the substrate, and ii) exposed electrical components positioned on the top surface of the substrate that are in superimposition with the electrically conducive TIM that extends beyond the top surface of the bare die, wherein a top surface of the gasket and a top surface of the electrically conductive TIM are substantially flush, wherein the top surface of the electrically conductive TIM and the top surface of the gasket are opposite the top surface of the substrate,
wherein the gasket is in superimposition with the substrate and the portion of the electrically conductive TIM that extends beyond the bare die is in superimposition with the gasket such that the gasket is i) positioned between the electrically conducive TIM that extends beyond the bare die and the exposed electrical components on the top surface of the substrate and ii) is in contact with the bare die such that the gasket inhibits contact between the electrically conductive TIM that extends beyond the bare die and the exposed electrical components that are in superimposition with the electrically conductive TIM.

16. The apparatus of claim 15, wherein the gasket includes an opening, the gasket positioned on the top surface of the substrate such that the bare die is positioned within the opening.

17. The apparatus of claim 15, wherein the gasket comprises a silicon-based material.

\* \* \* \* \*